March 18, 1969 W. C. ROSVOLD 3,432,919

METHOD OF MAKING SEMICONDUCTOR DIODES

Filed Oct. 31, 1966

INVENTOR
WARREN C. ROSVOLD
BY [signature]
AGENT

United States Patent Office 3,432,919

Patented Mar. 18, 1969

3,432,919
METHOD OF MAKING SEMICONDUCTOR DIODES

Warren C. Rosvold, Sunnyvale, Calif., assignor to Raytheon Company, Lexington, Mass., a corporation of Delaware Filed Oct. 31, 1966, Ser. No. 590,640
U.S. Cl. 29—578 8 Claims
Int. Cl. B01j *17/00;* H01l *5/00, 7/00*

ABSTRACT OF THE DISCLOSURE

A method of making semiconductor diode units from a wafer cut in the [100] crystallographic plane by applying contact material to both sides, temporarily securing the wafer to a handle means, etching normally to the [100] plane between units to sever them, and removing the handle means.

This invention relates to novel semiconductor diodes and method of making same, and has particular reference to high voltage microwave diodes and to a process for fabricating such diodes on a high volume production basis.

Microwave diodes of the semiconductor type such as are used in phased array antennas, step recovery devices, and the like depend for satisfactory operation not only on the doping levels of their electrodes and resultant carrier interaction but also, to a large extent, on their physical profiles. Such diodes commonly comprise a body of semiconductor material having P- and N-type conductivity regions spaced apart by a basically intrinsic region. The profiles or exterior configurations of such diodes have been found to be extremely critical for efficient operation.

Diodes of this type in the past have been made by laborious and costly processes, many of the processing steps being manually achieved or performed by mechanical means which creates damage and adversely affects device operation. Consequently, volume production of such devices is limited.

In accordance with the present invention, there is provided a novel method of making microwave and other devices which permits high volume production without the requirement for any mechanical operations once doping levels are established. The devices are processed in wafer form and the physical profiles are established by novel etching techniques. Furthermore, metal contacts to the P- and N-type regions are simple and efficiently performed before the profiles of the devices are defined, thus eliminating certain prior art procedures which often resulted in damage or deformation of the devices. Such batch processing achieves high volume production of diodes of this type with the required critical doping levels and precisely formed and shaped profiles which provide desired carrier interaction.

Other advantages and objectives of this invention will become apparent from the following description taken in connection with the accompanying drawings, wherein.

Figure 1:
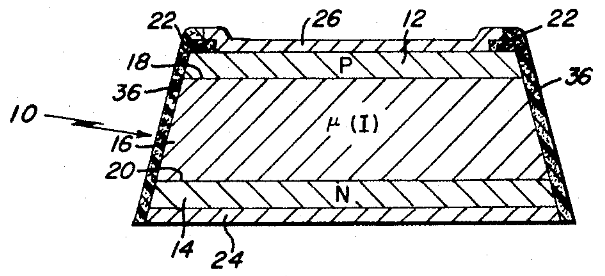
FIG. 1 is a vertical sectional view through a diode embodying a preferred form of the invention.

Referring more particularly to FIG. 1, there is shown a microwave diode 10 of the P-I-N type wherein a P-type conductivity region 12 is separated from an opposing N-type conductivity region 16. A first barrier or junction

18 lies between regions 12 and 16 and a second barrier or junction 20 lies between regions 14 and 16. The device is formed by initially providing a single crystal silicon chip or wafer which has a thickness and resistivity in accordance with the device requirements, that is, which establishes the capacity of the device and, consequently, the operating frequency. It has been found that for a range of from about 500 volts to about 1000 volts the thickness should be about 100–200 microns and the resistivity should be about 300 ohms cm.

When making an intrinsic wafer, it is necessary to provide a dopant in extremely small amounts which will provide the desired resistivity. Ordinarily, the term "intrinsic" refers to a pure or nearly pure silicon crystal. However, the term broadly refers to a crystal which is not absolutely pure but which contains very slight amounts of an impurity which tends to make the intrinsic layer slightly N-type or P-type, depending upon the type of impurity or dopant. For example, when growing the crystal from a seed of N-type or P-type material, in the absence of additional impurity-introducing agents the crystal will inherently become slightly N-type or P-type depending upon the type of seed employed. This is well known in the industry and, therefore, it is not believed necessary to go into further discussion here of the intrinsic wafer other than to point out that as the amount of impurity increases the resistivity decreases.

The crystal ingot from which the wafer is grown is sliced in the [100] plane, said plane having [100] axes extending normally thereto and a flat is ground at one edge of the wafer normal to the [100] plane. The flat is used for alignment in the proper crystallographic orientation, which is necessary for the mesa etch process to be hereinafter described. The wafer is processed by conventional lapping, polishing and etching procedures to a desired resultant size, such as about 100–200 microns thick and one inch in diameter, for example. This wafer during subsequent processing becomes the intrinsic layers 16 of all the diodes being produced on the single substrate.

The wafer processed as above-described is then oxidized on one surface to provide a layer of silicon dioxide thereon of 2–4 microns in thickness, this being done by any conventional thermal growing or other oxidation process as is well known in the art. For simplification of the oxidation process, both of the opposing surfaces of the wafer may be simultaneously oxidized, if desired, with the oxide layer on one surface thereafter being removed by abrasion or by etching with a solution containing about one part of hydrofluoric acid (HF) and nine parts of ammonium fluoride ($NH_4F$), followed by rinsing in water and drying.

The nonoxidized surface is then provided with a layer 14 of N-type silicon. This layer 14 is a single crystal epitaxy formed by growing silicon tetrachloride, silane or tetraorthosilicate with a reducing compound such as hydrogen in vapor form onto the wafer surface in a furnace at about 800–1200° C. for about 8 to 12 minutes to produce layer 14 about 20–30 microns thick. Layer 14 is provided with N-type conductivity by doping with antimony, arsenic, phosphorus or other N-type dopant to have a resistivity of about less than about .01 ohm cm. but these parameters may be varied depending upon the device requirements.

At this point, the epitaxially deposited N-type layer is oxidized and the oxide layer on the opposite side of the wafer is removed. Such oxide deposition and removal procedures are again performed by conventional and well-known techniques as set forth above.

Now a P-type layer 12 is epitaxially deposited on the nonoxidized surface opposite layer 14. This is done by growing onto the wafer a single crystal epitaxy formed by reacting silicon tetrachloride, silane or tetraorthosilicate with a reducing compound such as hydrogen in vapor form in a furnace at about 800–1200° C. for about 4 to 8 minutes to produce layer 12 about 12–16 microns thick. Layer 12 is provided with P-type conductivity by doping with boron or other P-type dopant to have a resistivity of about less than about .01 ohm cm., but, here again, these parameters may be varied depending upon the device requirements.

It is to be understood that the P-type layer may be formed before the deposition of the N-type layer 14, if desired. In the present example, the intrinsic layer 16 is slightly N-type since it is desired that the P-N junction 18 be considered and utilized as the major junction.

At this point, the surface of P-layer 12 is oxidized as described above so that the opposing sides of the wafer are provided with oxide-coated P- and N-type layers 12 and 14 respectively.

The next few steps in the process are concerned with the making of metal contacts on layers 12 and 14. To do this, an oxide pattern or mask is first formed on the surface of P-layer 12 and the oxide is completely removed from the surface of the N-layer 14. The oxide mask is indicated by numeral 22 in FIG. 2. The particular masking technique used here is not in itself unique insofar as this invention is concerned and, therefore, will only briefly be described herein. A photographic film is prepared with the desired pattern thereon, and the P-type material is provided with a coating of photoresist material, such as the solution known as KPR sold under that terminology by Eastman-Kodak Co., for example. This photoresist coating is exposed through the film to ultraviolet or other radiation to which it is sensitive, and developing takes place by dipping the wafer in a solution such as trichloroethylene to remove unsensitized KPR. The wafer is then baked at about 150° C. for about ten minutes whereupon the oxide supports thereon a resultant hardened photoresist mask having the desired configuration of the diodes to be formed in accordance with this invention.

Figure 2:
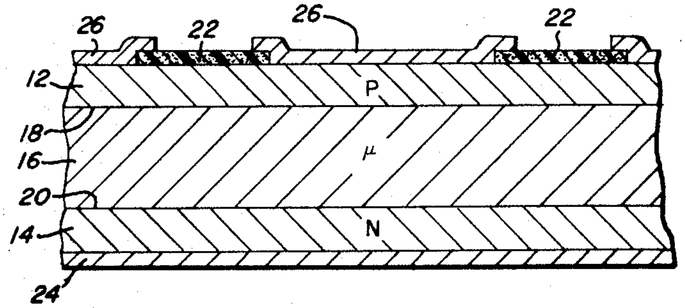
FIGS. 2 and 3 are enlarged diagrammatic fragmentary vertical sectional views of a diode of the invention illustrating various steps in the process of manufacture thereof; and, FIG. 4 is an enlarged fragmentary vertical sectional view through the device of FIG. 3 illustrating particularly the step of separating the structure into individual diodes.

The wafer is then placed in a solution containing about one part of hydrofluoric acid (HF) and nine parts of ammonium fluoride ($NH_4F$) to etch away the exposed areas of silicon dioxide, following which it is rinsed in water and dried. The photoresist pattern may now be removed by subjecting it to a solution of one part sulphuric acid and nine parts of nitric acid at about 100° C. for about ten minutes. This leaves the oxide mask 22 as shown in FIG. 2.

At this point a layer 24 of nickel is evaporated onto the surface of the N-layer 14 and a layer 26 comprising aluminum and silver is evaporated onto the P-layer 12. Layer 26 is preferably accomplished by first depositing a thin layer of aluminum to a thickness of about one micron and then depositing thereover a layer of silver, followed by alloying at a temperature of about 600° C. The silver is provided in an amount whereby when alloying has been completed there results a silver-aluminum deposit wherein the aluminum constitutes about 30% by weight of the combination. The actual evaporation processes may be any of the conventional well-known techniques. It should be understood that during the alloying procedure, the nickel layer 24 becomes sintered. In FIG. 2 the combined aluminum-silver deposit is shown as a single layer.

After the metal layers are thus deposited, the aluminum-silver layer 26 is restricted to the desired contact pattern by using conventional photoresist and etching techniques. Briefly, this comprises providing over layer 26 a pattern of photoresist material such as KPR and then etching away the exposed areas of layer 26 by removing the silver with dilute hydrogen peroxide followed by etching away the aluminum with a solution of 10% sodium hydroxide in water. The photoresist pattern is designed to cover the areas which are to be subsequently made into individual devices. Thus, the layer 26 will be removed in areas overlying the oxide deposits 22, as shown in FIG. 2. The remaining photoresist is thereafter removed as described above so that on the surface of P-layer 12 there will be provided metal contact areas 26 separated by oxide areas 22. The sequence of first applying the nickel layer 24 and thereafter depositing the aluminum-silver layer 26 may be reversed if desired.

At this point in the procedure a mask 28 (FIG. 3) is laid down over the surface of the P-layer 12, that is, completely over areas 22 and 26. This mask must be of a material which will adhere to both the exposed oxide areas 22 and the remaining aluminum-silver areas 26. Such a mask preferably comprises first a layer of chromium which is evaporated onto the structure to a thickness of about 500 Angstroms, and a layer of gold about 4000 Angstroms thick which is evaporated onto the chromium layer. The evaporation process is conventional and well known and since details thereof can be found in many well-known and readily available texts, a further description is not given here.

Figure 3:
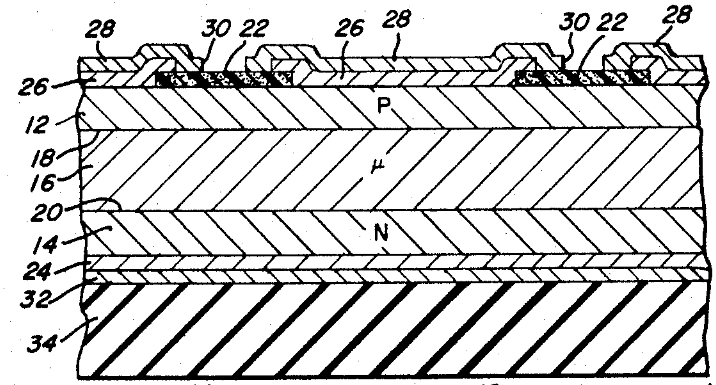

The mask 28 is provided with windows 30 therethrough by the photoresist and etching procedure described above, which windows are adapted to expose the oxide deposits 22 as shown in FIG. 3. These windows are provided for the purpose of defining the areas which are to be etched away in forming the individual diode units, as will be described.

At this point, since sintered nickel does not provide a satisfactory material to which electrical connections may be soldered, a continuous metal contact is provided over the sintered nickel layer 24. This is accomplished by metallizing the sintered nickel layer 24 with a first layer of nickel plate about 2000 angstroms thick followed by a plated layer of gold about 2000 angstroms thick, this metallized composite layer being indicated in FIG. 3 as a single layer 32.

Before the individual units are formed, it is necessary in accordance with this invention to mount the structure on a suitable handle which will support the wafer during subsequent processing and then will continue to support the individual units for subsequent processing. Such a handle is provided by coating the layer 32 with a substrate 34 of silicone rubber which may be applied as a gummy substance which will harden to the desired extent to serve as a support for the mesas to be formed.

At this point the wafer is separated into the several individual diode units by first etching through exposed silicon dioxide areas 20 by using hydrofluoric acid and ammonium fluoride, rinsing, and drying, as described above, to open windows through which the single crystal layer 12 is exposed. Then the crystal layers 12–16–14 are completely etched through by placing the wafer in a suitable rack and heating it in boiling water to preheat it to a temperature of about 115° C. and then subjecting it to a selected etchant which is maintained at about the same temperature. This etchant is a saturated solution of at least 25% of sodium hydroxide (NaOH) in water, preferably in an amount of 33%. The preheated wafer is subjected to the etchant for the time necessary to etch completely through the crystal semiconductor material layers 12–16–14 down to the sintered nickel layer 24. This etching takes place along the [100] planes of the single crystal material as is explained more fully in copending U.S. application Ser. No. 520,506, filed by Warren C. Rosvold and assigned to the same assignee as the present invention. By such crystal-oriented etching there is yielded a mesa slope having an angle which closely approximates the theoretical optimum of 60°, which slope angle is continuous from the P-region 12 through the N-region 24.

Then, after suitable rinsing and drying, the structure is subjected to a nitric acid bath which etches through the nickel layer 24 and through the nickel in layer 32. After rinsing and drying, the gold in layer 32 is etched through by a solution of potassium iodide. This step also removes the gold layer 28 from the top surface of the structure. Both of these metal etching processes are conventional and well known.

Figure 4:
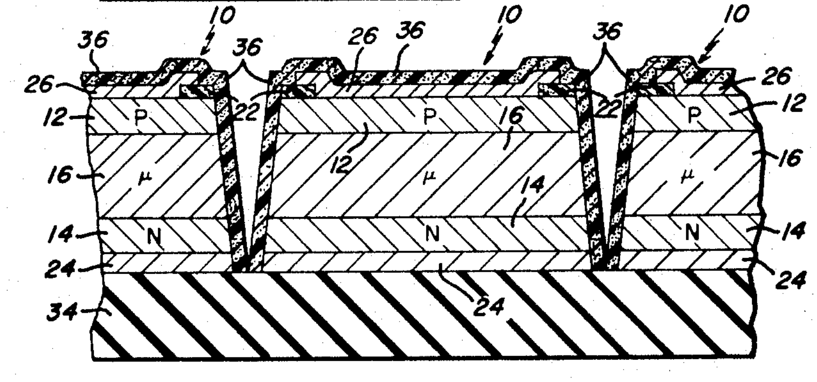

Thus there is provided a structure as shown in FIG. 4 wherein the structure has been separated into a number of diodes 10, all mounted on a single rubber handle 34. These diodes are all capable at this point of functioning as electronic components once suitable electrical potential is supplied to the metal contacts 26 and 24, the two metal layers 24 and 32 being shown in FIG. 4 as a single metal layer or contact 24.

However, in order to permit the diodes to operate at high voltages without arcing, the diodes are provided with a heavy oxide passivation coating 36 which completely covers the side walls of each diode as well as the upper surface thereof, as shown in FIG. 4. This oxide coating is at least about two microns thick and is preferably provided by reacting silane, silicon tetrachloride or tetraorthosilicate, preferably silane, with a reducing agent such as carbon dioxide or oxygen in vapor form onto the diode surfaces at a low temperature, such as about 300° C., which will not detrimentally affect the rubber handle 34. A passivation coating of two microns thickness can be provided in about 20 minutes.

Then the metal contact 26 is exposed by removing oxide 36 from the areas overlying metal 26 by using the conventional photoresist and oxide etching techniques described above. Then the rubber handle 34 is removed by using an organic solvent which will not attack any of the other diode parts. This can be done by using xylene at 120° C., for example.

From the foregoing it will be apparent that a novel technique for making microwave diodes and other similar devices on a high volume production basis has been provided in accordance with the objectives of this invention. While many of the various steps comprising the technique are old and well known, the combination thereof results in a technique which achieves such high volume production in contrast to the slow, tedious, and difficult methods heretofore employed in the manufacture of these devices.

Various modifications and changes may be made, however, by those skilled in the art without departing from the spirit of the invention as set forth in the accompanying claims.

I claim:

1. The method of making semiconductor diodes, comprising the steps of making a structure comprising a layer of intrinsic single crystal semiconductor material of selected resistivity with its [100] crystallographic axes extending substantially normal to its plane surfaces and having on its opposed plane surfaces respective single crystal P-type and N-type conductivity regions forming barriers between said regions and intrinsic material, depositing first and second metal contacts on respective ones of said regions, mounting said structure by one of said contacts on a handle, etching the structure completely through to said handle along said [100] crystallographic axes to separate the structure into a plurality of mesa diodes all supported in assembled spaced relation on said handle, passivating the edges of said barriers, and removing the handle to liberate the diodes therefrom.

2. The method of making precisely configured semiconductor diodes on a high volume production basis comprising the steps of making a wafer of intrinsic semiconductor material having a selected resistivity and having its [100] crystallographic axes extending substantially normal to the plane surfaces thereof, depositing on opposite plane surfaces of the wafer respective regions of P-type and N-type conductivity semiconductor material to form barriers between said regions and said intrinsic material, depositing a continuous metal contact layer on a first of said regions, depositing metal contact material in a plurality of selected areas over the second of said regions, alloying said metal contacts into the respective underlying regions, mounting said wafer by the continuous metal contact layer on a handle for supporting the wafer during subsequent processing, etching through said second region, through said wafer along the [100] crystallographic axes thereof, and through said first region and the continuous metal contact layer thereon to separate the wafer into a plurality of separate mesas all supported in assembled spaced relation with one another on said handle, coating the side walls of the separate mesas with a passivation coating, and removing the handle to separate the mesas from the assembly.

3. The method set forth in claim 2 wherein the etching step is accomplished with an etching solution comprising a saturated solution of sodium hydroxide in water.

4. The method set forth in claim 3 wherein said etching step includes masking the metal contact areas on said second region with a material which is insensitive to sodium hydroxide.

5. The method set forth in claim 4 wherein said masking material comprises a combination of chromium and gold.

6. The method of making precisely configured semiconductor diodes on a high volume production basis comprising the steps of making a wafer of intrinsic semiconductor material having a selected resistivity and having its [100] crystallographic axes extending substantially normal to the plane surfaces thereof, depositing on opposite plane surfaces of the wafer respective regions of P-type and N-type conductivity semiconductor material to form barriers between said regions and said intrinsic material, depositing a continuous metal layer on a first of said regions, depositing metal contact material in a plurality of selected areas over the second of said regions, heating the structure to alloy said metal contact material into the respective underlying regions of said second region and to sinter said continuous metal layer on said first region, mounting said wafer by its side which carries the continuous sintered metal layer on a handle for supporting the wafer during subsequent processing, etching through said second region, through said wafer along the [100] crystallographic axes thereof, and through said first region and the continuous sintered metal layer thereon to separate the wafer into a plurality of separate mesas all supported in assembled spaced relation with one another on said handle, coating the side walls of the separate mesas with a passivation coating, and removing the handle to separate the mesas from the assembly.

7. The method set forth in claim 6 wherein said mounting step comprises adhering said continuous metal contact layer to a layer of silicone rubber.

8. The method set forth in claim 6 wherein the step of depositing a continuous metal layer comprises applying to said first region a layer of nickel, wherein said mounting step includes first depositing over said sintered metal layer an overlayer of metal to which electrical leads can be subsequently soldered, and wherein said etching step includes etching through said overlayer of metal.

(References on following page)

References Cited

UNITED STATES PATENTS

| | | | |
|---|---|---|---|
| 3,237,272 | 3/1966 | Kallander | 29—589 |
| 3,288,662 | 11/1966 | Weisberg | 156—11 |
| 3,332,143 | 7/1967 | Gentry | 29—583 |
| 3,349,475 | 10/1967 | Marinace | 29—578 |

WILLIAM I. BROOKS, *Primary Examiner.*

U.S. Cl. X.R.

29—580, 589; 148—1.5; 156—17; 317—234